United States Patent [19]

Seddon et al.

[11] Patent Number: 5,112,644
[45] Date of Patent: May 12, 1992

[54] HORIZONTAL PRECESSION TOOLING AND METHOD FOR TUBE ROTATION

[75] Inventors: Richard I. Seddon; Michael D. Temple, both of Santa Rosa, Calif.

[73] Assignee: Optical Coating Laboratory, Inc., Santa Rosa, Calif.

[21] Appl. No.: 491,474

[22] Filed: Mar. 8, 1990

[51] Int. Cl.$^5$ ............... C23C 14/34; C23C 14/50; C23C 16/50; C23C 14/32

[52] U.S. Cl. .................. 427/38; 427/39; 427/255.5; 118/729; 118/730; 204/192.31; 204/298.05; 204/298.15; 204/298.23; 204/298.27; 204/298.28; 414/910

[58] Field of Search ............ 204/298.15, 298.23, 204/298.27, 298.28, 298.29, 192.12, 192.31, 298.05; 118/730, 729; 427/38, 39, 255.5; 414/910

[56] References Cited

U.S. PATENT DOCUMENTS

| | | | |
|---|---|---|---|
| 4,650,064 | 3/1987 | Slabaugh | 204/298.27 |
| 4,777,908 | 10/1988 | Temple et al. | 118/719 |
| 4,851,095 | 7/1989 | Scobey et al. | 204/194.12 |
| 4,858,558 | 8/1989 | Ohmura et al. | 118/730 |

FOREIGN PATENT DOCUMENTS

| | | |
|---|---|---|
| 62-33074 | 6/1987 | Japan . |
| 63-206469 | 8/1988 | Japan . |
| 1-15371 | 1/1989 | Japan . |

*Primary Examiner*—Shrive Beck
*Assistant Examiner*—Margaret Burke
*Attorney, Agent, or Firm*—Philip A. Dalton

[57] ABSTRACT

A simple, double rotary workpiece or cage holder is disclosed for coating articles such as tubes or article-holders. The articles or article holders are supported in oversized support holes or on undersized pegs so that rotation of the cage about a horizontal axis causes gravity-induced precession of the tubes. The center of gravity of the article holders may be displaced so that the article holders are maintained at an acute angle relative to the cage axis, to facilitate coating difficult shapes such as lenses.

12 Claims, 4 Drawing Sheets

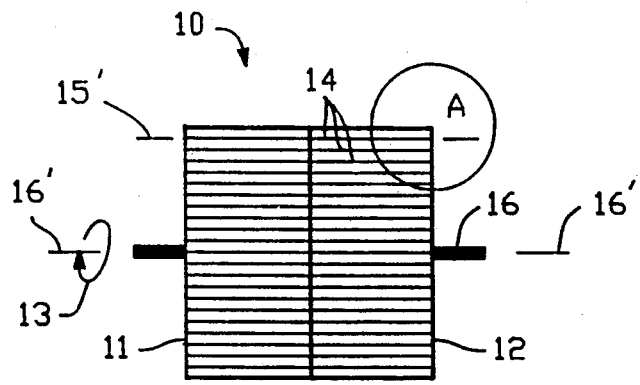
FIG.—1
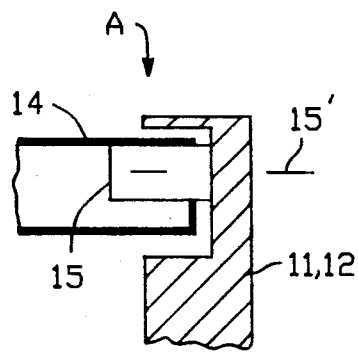
FIG.—2
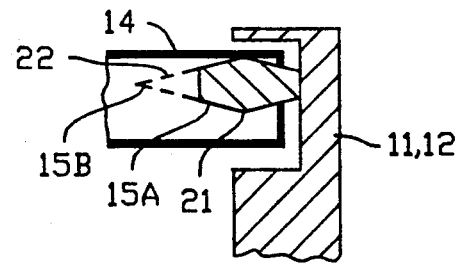
FIG.—3
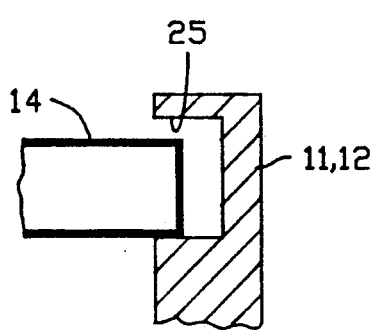
FIG.—4
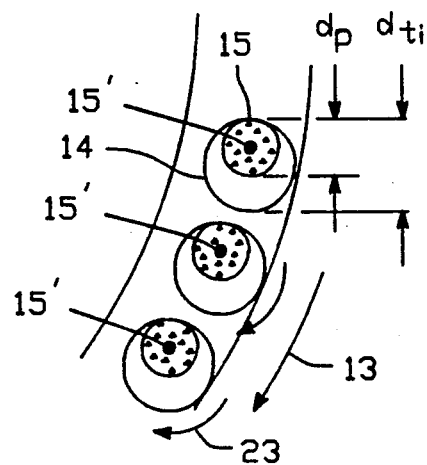
FIG.—5

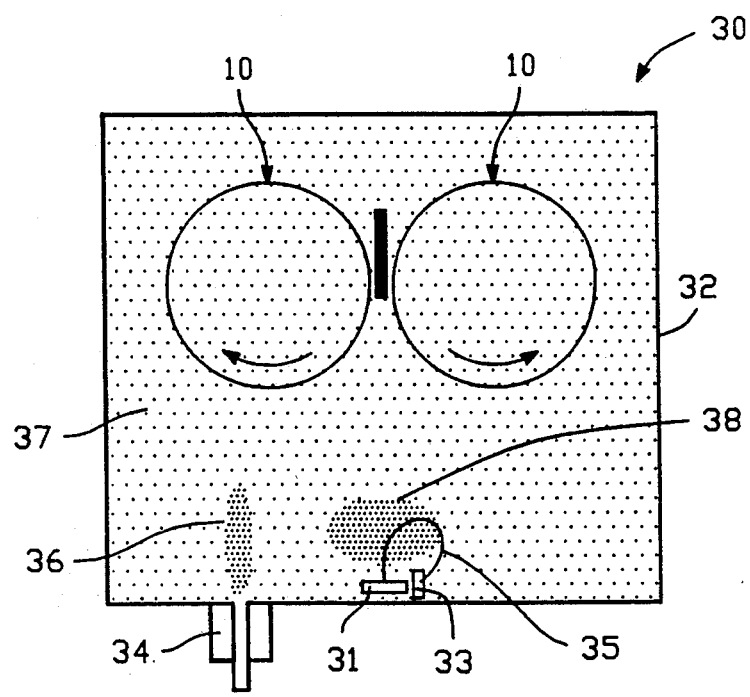
FIG.—9
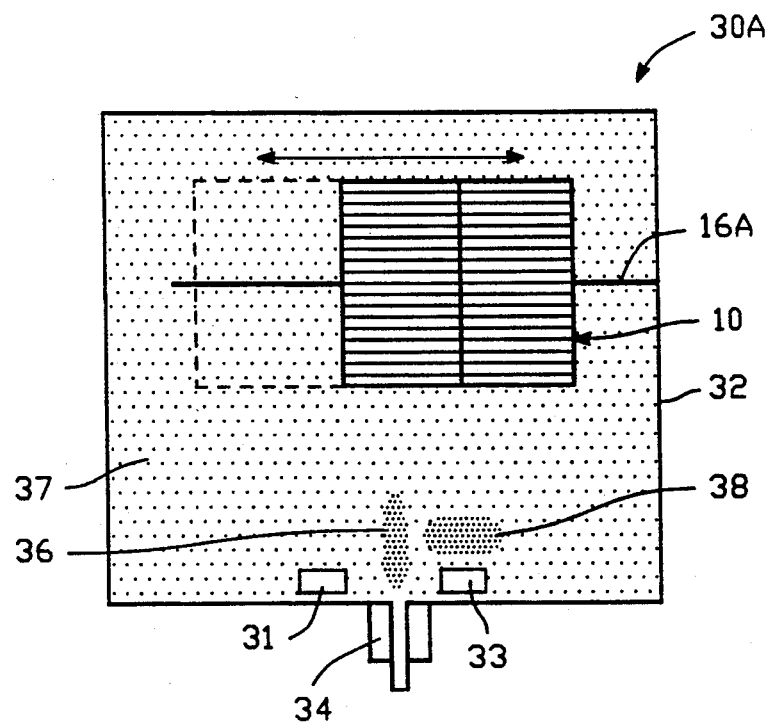
FIG.—10

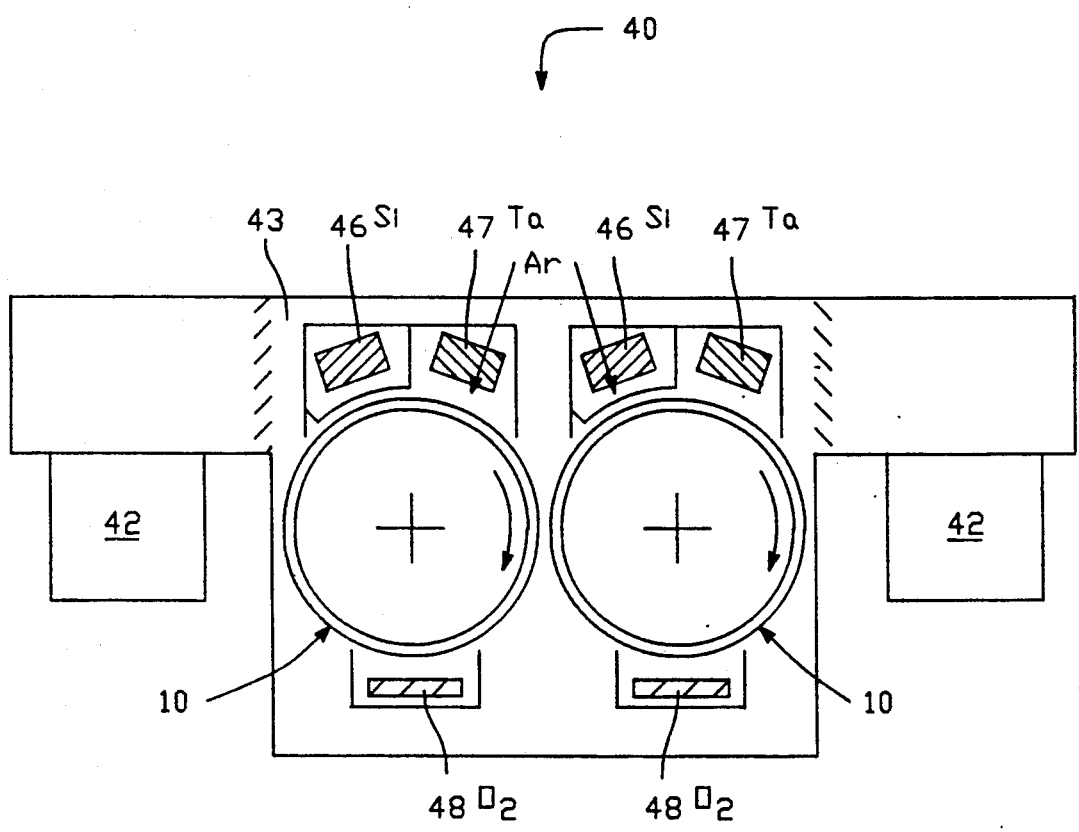
FIG.—11

HORIZONTAL PRECESSION TOOLING AND METHOD FOR TUBE ROTATION

FIELD OF THE INVENTION

The present invention relates, in part, to sputtering and ion-plating systems and similar systems and to workpiece mounting and transport apparatus used in such systems.

BACKGROUND OF THE INVENTION

There are available a number of techniques for holding and moving workpieces within plasma processing chambers. For example, workpiece-mounting drums or cylinders are used to provide single rotational movement (rotation about the drum axis), while planetary-type systems are used to impart double axis rotational movement (separate rotational movement about the drum axis and the planet axis). Typically, the tooling used in such systems is complex and expensive and may incorporate moving parts that must be isolated components from the processing chamber environment.

SUMMARY OF THE INVENTION

Background of the Invention

As implied in the above discussion, it is one object of our present invention to provide a double-rotational workpiece support which is simple and relatively inexpensive. It is another related object of our present invention to provide such a workpiece support which eliminates sources of particulate generating, surface-to-surface contact such as gear devices.

Summary of the Invention

In one aspect, our invention which satisfies the above as well as other objectives, is embodied in a double rotation workpiece mounting transport system comprising a cylindrical support such as a cage or plate having a first rotational axis. The support is adapted for loosely capturing one or more substrates or substrate mounting members for gravity-induced rotation or precession of the substrates or substrate mounting members about a second rotational axis during rotation of the support about the first axis.

The cage or rack means may take various alternative forms including, but not limited to, a single plate or spaced plates adapted for rotatably capturing substrates or substrate holders. Other embodiments include substrate holders which are weighted so that the holder is angled downwardly by gravity relative to the horizontal, for equalizing deposition on difficult-to-coat substrate shapes. In another method aspect, our invention relates to a method of imparting double rotary movement to a substrate which comprises providing a cage rack which is rotatable about a first axis and is adapted for loosely holding substrates or substrate holders for rotation about a second axis spaced from the first axis; and rotating the cage about the first axis with the orientation of the first axis such that the article is rotated about the second axis by gravity.

BRIEF DESCRIPTION OF THE DRAWINGS

The above and other aspects of our invention are disclosed with respect to the enclosed drawings, in which:

FIG. 1 is a simplified schematic side view of a cylindrical support rack which rotationally supports substrate, for gravity-induced precession.

FIGS. 2, 3 and 4 depict alternative approaches for rotatably supporting substrates or substrate supports in the rack or cage of FIG. 1;

FIG. 5 schematically depicts a peripheral section of one end of the cage, viewed from the inside, showing the tubes undergoing precession during rotation of the cage;

FIGS. 9 and 10 schematically depict the use of our double rotational gravity-assisted, horizontal precession, support cage in ion plating chambers of the type disclosed in our commonly assigned Temple, Seddon et al U.S. Pat. No. 4,777,908; and FIG. 11 schematically depicts the use of our gravity-assisted, horizontal precession, cylindrical support cage in a magnetron-enhanced sputtering chamber of the type disclosed in commonly assigned Scobey, Seddon et al U.S. Pat. No. 4,851,095.

Figure 6:
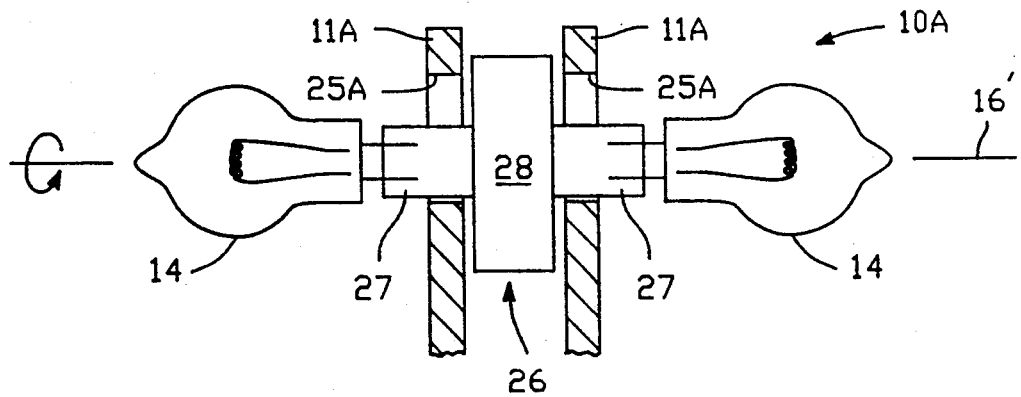
FIGS. 6 and 7 schematically depict alternative cages which capture substrate holders.

Both above-mentioned U.S. Pat. Nos. 4,777,908 and 4,851,095, are incorporated by reference in their entirety, in particular for their disclosure of exemplary reaction chambers which benefit from our present invention and also for the disclosure in the '095 patent of techniques for mounting a cage or drum and rotational control of the cage.

DETAILED DESCRIPTION OF THE PREFERRED EMBODIMENT(S)

In one aspect, our present invention relates to a method of obtaining rotation of tubes or other substrates or of substrate holders by precession under the influence of gravity, using oversized support holes or undersized pegs in a cylindrical support rack or cage.

FIG. 1 schematically depicts a cylindrical support cage 10 which embodies our present invention. The cage 10 has a pair of spaced end plates 11, 12 from which protrude a shaft 16 which is mounted to a support such as a vacuum processing chamber. The shaft and cage are rotated by a motor (not shown) about the rotation axis 16' associated with the shaft 16. Tubular substrates 14 (or tubular supports which mount substrates thereon) are rotatably mounted to the opposite ends 11, 12 of the rack 10, typically in a peripheral array.

As shown in mounting detail A, FIG. 2, in one embodiment the opposite ends of the tubes may be supported on undersized pegs 15 at the opposite ends of the rack. (By "undersized", we mean the outside diameters of the pegs are smaller than the inside diameters of the tubes.) Referring also to FIG. 5, during rotation of the cage 10 along path 13 about axis 16', each tube 14 rotates by precession along associated path 23 about axis 15', under the influence of gravity. Please note, the system is very well suited to operation in vacuum environments, such as plasma processing chambers, where friction is high and the tube "walks" about the peg without slipping.

In short, our cage means or rack means provide a simple, rugged platform for planetary-type, double axis rotation, without the complexity, cost, maintenance or the potential for particulate generation which are associated with planetary systems.

FIG. 3 depicts an alternative mounting arrangement in which the pegs 15A are beveled at both ends, defining a relatively large diameter, intermediate circumferential crown line 21 for supporting the tube 14. In this manner, the tube 14 is supported along a line which is removed from the end of the tube (compare FIG. 2 in which contact between the tube and peg extends to the end of the tube), thereby decreasing the possibility of chipping or otherwise damaging the end of tubes constructed of fragile material such as glass. Also, as indicated by the dotted line 22 in FIG. 3, one or both pegs may be elongated to securely retain the tube on the pegs. In a presently preferred arrangement for the crowned pegs, the support pegs at one end are the elongated versions 15B, while those at the opposite end are the truncated version 15A, to facilitate loading and unloading tubes.

In still another alternative mounting arrangement depicted in FIG. 4, the tubes 14 are mounted for precession rotation in oversized holes 25 in the ends 11, 12 of the cage.

FIG. 6 depicts an alternative cage or rack 10A which includes closely spaced end plates 11A, 11A having pairs of aligned holes 25A, 25A formed along their peripheries. A cylindrical holder 26 for the workpiece(s) 14 has oppositely-extending shafts or mounting spindles 27, 27 which extend from an enlarged center section 28 through the associated holes. The enlarged center section 28 prevents or limits longitudinal movement, depending upon its width relative to the between-plate spacing. Various types of substrates including, but not limited to, lamps, tubes, prisms, conical sections, etc., can be mounted on one or both of the shafts 27, 27. Cage 10A imparts to the substrate(s) 14 the same double rotational gravity-induced precessional movement that was described above relative to FIGS. 1 et al.

Figure 7:
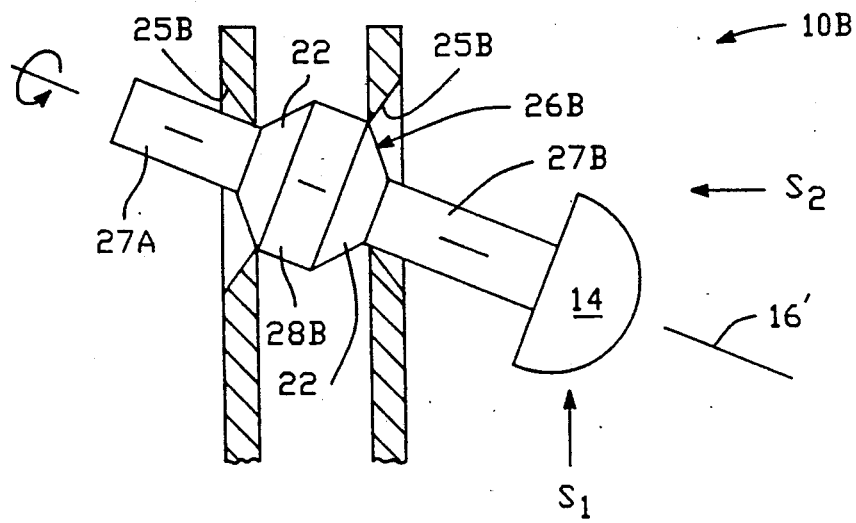

FIG. 7 depicts another alternative cage or rack, one designated 10B, which is a modification of the system 10A, FIG. 6. Illustratively, one spindle 27B is longer than the other, 27A; the resulting greater weight of the elongated spindle 27B and the axially offset center of gravity maintains that spindle and the substrate 14 thereon in a gravity-induced, down position. The angled orientation of the spindles and of the associated precession axis relative to their normal horizontal orientation (FIG. 6) makes the system 10B especially useful for difficult-to-coat shapes such as curved lenses, steep cones, etc. Ordinarily, if such a curved substrate were mounted along a horizontal precession axis, a source, $S_1$, which is located at the bottom (or top) of the chamber would coat the substrate primarily along its edge, while a horizontally-oriented (side mount) source, $S_2$, would tend to coat the substrate middle much more heavily than the edge. In contrast, the angled shaft system 10B enables more uniform coating across the substrate from edge to center, while the gravity-induced precessional rotation extends the uniform coating 360° around the circumference of the substrate.

Please note, the sides 22 of the center section 28B of the substrate holder 26B and the plate holes 25B may be beveled to accommodate the angled orientation of the holder 26B. The holes 25B, 25B preferably are aligned along the horizontal. Also, the bevel angle of the holes 25B, 25B and of the sides 22, 22 of the holder center section 28B can be selectively varied to impart different angular orientations to the shaft 27, provided by a given weight/center of gravity to accommodate different substrate shapes and/or source positions.

Figure 8:
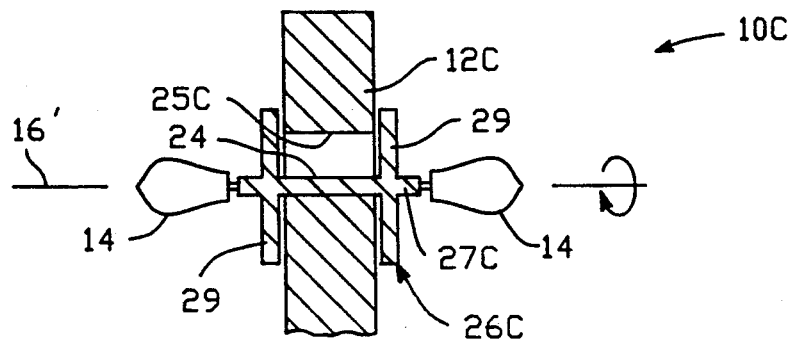
FIG. 8 schematically depicts an alternative single plate cage.

FIG. 8 depicts still another alternative embodiment of the rack or cage 10A, FIG. 9, which is designated 10C. The single plate system 10C can provide an angled shaft orientation by employing the same modifications discussed relative to FIG. 7, that is, for example, by using a longer, heavier shaft 27C on one side of the holder and beveling and/or aligning the hole to accommodate the gravity-induced angular orientation of the holder. The version 10C comprises a singular circular plate 12C having a peripheral array of relatively large holes 25C. The illustrated holder 26C has a pair of holder plates 29, 29 which are located on opposite sides of rack plate 12C and are connected by a relatively small shaft or spindle member 24. The member 24 may comprise separable male and female sections which permit ready mounting of the part to the plate and removal. The described part holder permits gravity-induced precessional movement and prevents or limits longitudinal movement along the precessional axis, depending upon the spacing of the plates 29, 29 relative to the width of the plate 12C. Substrates 14 may be mounted on one or both sides of the holder 26C, to the outside plates 29, 29. The single plate cage or rack 10C imparts to the substrate(s) the same type of gravity-induced precessional movement and double rotational movement that was described above relative to FIGS. 1 et al.

In the above mounting embodiments, the tube is supported in essentially a friction planetary gear drive in which the tube rotates a fraction of a revolution for every revolution of the cage. That is, for the undersized peg supports shown, for example, in FIGS. 2 and 3, the tube rotates $d_p/d_{ti}$ revolutions for each cage revolution, where $d_p$ is the contact diameter of the peg or support and $d_{ti}$ is the inside diameter of the tube end. Conversely, where the tube is supported in a hole as in FIG. 4, the tube rotates approximately $d_h/d_{to}$ for each revolution of the cage, where $d_h$ is the diameter of the hole and $d_{to}$ is the outside diameter of the undersized tube. Thus, for a support pin diameter two-thirds the inside diameter of the tube, the tube would advance or precess at two-thirds the squirrel cage rotation rate. Conversely, for an outside tube diameter two-thirds the inside diameter of the support hole, the tubes would advance or precess at one and one-half times the squirrel cage rotation rate.

To our knowledge, the only design constraints on this new type of planetary gear, double rotational system are that (1) the rotation rate for the squirrel cage should not exceed that at which centrifugal forces exceed gravity; and (2) the squirrel cage rotational rate and the relative diameters of the tubes and pegs and the tubes and holes must be selected to provide an acceptable number of revolutions during the processing cycle, for example, to provide complete, uniform coverage during ion plating or sputter coating operations.

EXAMPLES OF USE OF OUR INVENTION

FIG. 9 depicts a modified, double rotary version 30 of the plasma plating system disclosed in our incorporated Temple, Seddon et al U.S. Pat. No. 4,777,908. The system 30 includes an electrically conductive crucible 31 which is positioned within vacuum chamber 32 and is electrically isolated therefrom, but with a low resistance electrical connection therebetween. A high voltage electron beam source 33 is positioned within the vacuum chamber in the vicinity of the crucible 31 and includes a high voltage electron gun and a deflection magnet system (not shown) arranged for bending the electron beam 35 from the gun into the crucible for evaporating the source material therein. The magnet system also forms a magnetic field in the region above the crucible. A low voltage, high current plasma source including a separate plasma generating chamber 34 produces an intense plasma in the plasma generating chamber using a selected gas activation species from a source (not shown). This plasma is injected into the vacuum chamber 32 at 36. Also, the plasma source 34 is electrically interconnected with the crucible 31 externally to permit current flow therebetween. Illustratively, the chamber 32 incorporates one or more of our horizontal-cage substrate carriers 10—10, thereby combining the high rate plasma plating capability of the incorporated Temple, Seddon et al system with the uniformity, simplicity and relatively low expense and other advantages provided by our double rotary transport system.

Using the above-described arrangement, the plasma source 34 fills the vacuum chamber with a generally distributed plasma 37 which co-acts with the magnetic field above the crucible 31 and the evaporant material leaving the crucible to form an intense second plasma 38 in the region above the crucible, thereby activating the evaporant material passing through the region for uniform deposition on the substrates mounted on the rotary transport system 10, 10A, 10B or 10C.

FIG. 10 depicts an alternative version 30A of the ion plating system 30, in which a pair of sources 31 are used and the cage 10 is shuttled from one side of the chamber 32 to the other along shaft 16A for the purpose of ensuring similar distribution patterns from the two sources to the drums.

FIG. 11 depicts a modified double rotary version 40 of the magnetron-enhanced plasma plating systems described in incorporated Scobey, Seddon et al U.S. Pat. No. 4,851,095. The illustrated system 40 combines the high rate, variable composition, controlled film uniformity and controlled film non-uniformity characteristics provided by the incorporated Scobey, Seddon et al U.S. Pat. No. 4,851,095 with the uniformity, simplicity and relatively inexpensive tooling 10, 10A, 10B, 10C of our present substrate transport system. The system 40 illustratively incorporates one or more vacuum pumps 42 for maintaining the requisite vacuum level in the chamber 43, a plurality of sputtering devices 46 and 47 on the outside of the two cages 10, 10 facing inwardly (illustratively the devices 46 and 47 are silicon and tantalum sputterers, respectively) and reaction devices 48 such as oxidizers situated on the opposite side of the rotating cages 10, 10. The double rotary tooling 10, 10 of the present invention uniformly exposes the periphery of workpieces to the sputtering stations and oxidizers. By virtue of this arrangement and the multiple silicon, tantalum and oxidizing devices, the silicon and tantalum layers and the oxidation of said layers can be deposited at a high rate on a large number of substrates. For example, composite layers comprising $SiO_2$ and $Ta_2O_5$ can be formed by operating the oxidizer(s) 48 continuously while sequentially operating the silicon sputtering devices 46 and the tantalum sputtering devices 47. The use of silicon, tantalum and oxidizers is given by way of example only for numerous other materials may be sputtered or sputtered and reacted using this system.

Having thus described preferred and alternative embodiments of our invention as well as the examples of the usage of our invention, it will be understood by those of skill in the art that the invention defined in the appended claims includes numerous modifications which will be readily derived by those of usual skill in the art.

We claim:

1. Apparatus for imparting double rotary motion to an article or article holder, comprising: rack means mounted for rotation about a first axis, the rack means comprising two spaced plates; means for capturing a workpiece or workpiece holder between the two plates such that the article or article holder is rotatable about a second axis spaced from the first axis and said article or article holder remains in contact with both capturing means during rotation; and means mounting the rack means and orienting the second axis such that gravity-induced frictional contact between the article or article holder and the rack means rotates the article or article holder about the second axis during rotation of the rack means about the first axis.

2. The rotatable workpiece transport apparatus of claim 1, wherein the center of gravity of the holder is displaced toward one end thereof for orienting the holder at an acute angle relative to the second axis.

3. Apparatus for imparting double rotary motion to an article or article holder, comprising: rack means mounted for rotation about a first axis; means for loosely capturing at least one article holder to the rack means such that the article is rotatable about a second axis spaced from the first axis; means mounting the rack means and orienting the second axis such that gravity-induced frictional contact between the article and the rack means rotates the article about the second axis during rotation of the rack means about the first axis, wherein the rack means comprises a plate capturing a workpiece or workpiece holder thereto for rotation about the second axis and wherein the center of gravity of the holder is displaced toward one end thereof for orienting the holder at an acute angle relative to the second axis.

4. Apparatus for imparting double rotary motion to an article or article holder having tubular opposite ends, comprising: rack means mounted for rotation about a first axis, the rack means comprising two spaced plates oriented transverse to the first axis; pegs of smaller diameter than the tubular article ends mounted on the spaced plates for loosely capturing the article via the tubular ends thereof so that the article is rotatable about a second axis spaced from the first axis; and means mounting the rack means and orienting the second axis so that gravity-induced frictional contact between the article and the rack means rotates the article about the second axis during rotation of the rack means about the first axis.

5. Apparatus for imparting double rotary motion to an article or article holder having post opposite ends, comprising: rack means mounted for rotation about a first axis, the rack means comprising two spaced plates oriented transverse to the first axis; the plates having oppositely-positioned holes therein of diameter larger than the diameter of the posts, for loosely capturing the article via the post ends thereof so that the article is rotatable about a second axis spaced from the first axis; and means mounting the rack means and orienting the second axis such that gravity-induced frictional contact between the article or article holder and the rack means rotates the article or article holder about the second axis during rotation of the rack means about the first axis.

6. A method of imparting double rotary movement to an article having opposite tubular ends, comprising: providing a rack means comprising two spaced plates oriented transverse to a first axis and having oppositely-positioned pegs of diameter smaller than the diameter of the tubular ends; rotating the rack means about the first axis while capturing the article to the rack means so that the article is rotatable about a second axis spaced from the first axis and while orienting the second axis such that gravity-induced frictional contact between the article and the rack means rotates the article about the second axis.

7. A method of imparting double rotary movement to an article having opposite post-like ends, comprising: providing a rack means comprising two spaced plates oriented transverse to a first axis and having oppositely-situated holes of diameter larger than the diameter of the posts; rotating the rack means about a first axis while capturing the article to the rack means so that the article is rotatable about a second axis spaced from the first axis and while orienting the second axis such that gravity-induced frictional contact between the article and the rack means rotates the article about the second axis.

8. The rotatable workpiece transport apparatus of claim 6, wherein at least one of the pegs is beveled, defining a circumferential crown line spaced from the end of the article for supporting the article.

9. The method of claim 6 or 7, wherein the rack means is mounted within a vacuum chamber.

10. The method of claim 9, wherein the vacuum chamber is a thin film coating deposition chamber.

11. The rotatable workpiece transport apparatus of any of claims 8, 1, 2, 3, 4 or 5, wherein the rack means is mounted within a vacuum chamber.

12. The rotatable workpiece transport apparatus of claim 11, wherein the vacuum chamber is a thin film coating deposition chamber.

* * * * *